United States Patent
Yoshikawa et al.

(10) Patent No.: US 7,443,261 B2
(45) Date of Patent: Oct. 28, 2008

(54) PHASE MODULATING APPARATUS, COMMUNICATION DEVICE, MOBILE WIRELESS UNIT, AND PHASE MODULATING METHOD

(75) Inventors: Hiroyuki Yoshikawa, Tokyo (JP); Shunsuke Hirano, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 78 days.

(21) Appl. No.: 10/591,346

(22) PCT Filed: Dec. 22, 2005

(86) PCT No.: PCT/JP2005/023631

§ 371 (c)(1),
(2), (4) Date: Aug. 31, 2006

(87) PCT Pub. No.: WO2006/068237

PCT Pub. Date: Jun. 29, 2006

(65) Prior Publication Data

US 2007/0205831 A1 Sep. 6, 2007

(30) Foreign Application Priority Data

Dec. 24, 2004 (JP) ............................. 2004-373801

(51) Int. Cl.
*H03C 3/00* (2006.01)
(52) U.S. Cl. .................. 332/144; 332/128; 375/302; 331/23
(58) Field of Classification Search .............. 331/16, 331/17, 23; 332/144, 145, 103, 127, 128; 375/302, 308, 373, 374, 376; 327/156, 157; 455/102, 110
See application file for complete search history.

(56) References Cited

U.S. PATENT DOCUMENTS

| | | | |
|---|---|---|---|
| 6,211,747 B1 * | 4/2001 | Trichet et al. | 332/128 |
| 6,282,249 B1 | 8/2001 | Tomesen et al. | |
| 6,515,553 B1 * | 2/2003 | Filiol et al. | 332/127 |
| 7,154,347 B2 * | 12/2006 | Grewing et al. | 331/23 |
| 2002/0003481 A1 | 1/2002 | Kantola et al. | |
| 2002/0160804 A1 | 10/2002 | Bogner et al. | |
| 2004/0196924 A1 | 10/2004 | Wilson | |

FOREIGN PATENT DOCUMENTS

JP 04358415 A * 12/1992
WO WO 3032493 A2 * 4/2003

OTHER PUBLICATIONS

PCT International Search Report dated Feb. 28, 2006.

* cited by examiner

*Primary Examiner*—Robert J. Pascal
*Assistant Examiner*—Ryan J. Johnson
(74) *Attorney, Agent, or Firm*—Dickinson Wright, PLLC

(57) ABSTRACT

A multimode-based phase modulating apparatus capable of reducing the degradation of modulation precision and suppressing the unnecessary power consumption. This apparatus has a switch for switching the modulation modes of a PLL circuit between a single-point modulation and a double-point modulation. In a case of a narrow modulation bandwidth, the switch is turned off to cease a second digital baseband signal, thereby causing the PLL circuit to perform the single-point modulation in which only a first digital baseband signal from a frequency division rate generating part is used for the modulation. Contrarily, in a case of a wide modulation bandwidth, the switch is turned on, thereby performing the double-point modulation using both the first digital baseband signal and the second digital baseband signal.

11 Claims, 11 Drawing Sheets

PHASE MODULATING APPARATUS, COMMUNICATION DEVICE, MOBILE WIRELESS UNIT, AND PHASE MODULATING METHOD

TECHNICAL FIELD

The present invention relates to a phase modulation apparatus or the like that performs phase modulation using a PLL (Phase Locked Loop) circuit, and more particularly to a multimode capable phase modulation apparatus used as a communication device, such as a mobile phone or suchlike mobile communication device, or a base station that performs communication with a mobile communication device, a communication device and mobile radio device, and a phase modulation method.

BACKGROUND ART

Conventionally, a PLL circuit is generally utilized in a phase modulation apparatus used in a communication device. Requirements of a phase modulation method used by such a PLL circuit include low cost, low power consumption, good noise characteristics, and high modulation precision. In order to increase modulation precision, it is desirable for the PLL frequency bandwidth (hereinafter referred to as "PLL bandwidth") to be made wider than the frequency bandwidth of a modulation signal (hereinafter referred to as "modulation bandwidth") in the phase modulation method of such a PLL circuit. However, since noise characteristics degrade when the PLL bandwidth is widened, the result is that it is difficult to widen the modulation bandwidth and perform wideband modulation.

Thus, a 2-point modulation method has been proposed whereby the PLL bandwidth is set narrower than the modulation bandwidth, and modulation within the PLL bandwidth and modulation outside the PLL bandwidth are performed at two different places (see, for example, Patent Document 1). FIG. 1 is a block diagram showing the configuration of a phase modulation apparatus according to the prior art proposed in Patent Document 1. As shown in FIG. 1, the configuration of a phase modulation apparatus using a 2-point modulation method such as proposed in Patent Document 1 comprises a PLL circuit 20 that includes a reference oscillator 21, a limiter 22, a reference frequency divider 23, a phase frequency detector 24, a charge pump 25, a loop filter 26, an adder 27, a VCO (Voltage Controlled Oscillator) 28, and a frequency divider 29; as well as a modulator 30, an adder 31, a constant F 32, a delta sigma modulator 33, an adder 34, a constant P 35, a charge pump scaling section 36, and a modulation scaling section 37.

In FIG. 1, VCO 28 of PLL circuit 20 outputs an RF phase modulation signal of a frequency in accordance with the voltage input to the control voltage terminal of VCO 28. Frequency divider 29 divides the frequency of the RF phase modulation signal output from VCO 28. Phase frequency detector 24 compares the phase of the signal output from frequency divider 29 with the phase of a reference signal output from reference frequency divider 23, and outputs a signal in accordance with the phase difference. Loop filter 26 averages the output signal from phase frequency detector 24.

Modulation amplitude scaling section 37 outputs a modulation signal from adder 27 to VCO 28 based on modulation data. Charge pump scaling section 36 controls residual modulation within the phase locked loop by controlling charge pump 25, and thereby enables modulation to be output more accurately. That is to say, the phase modulation apparatus in FIG. 1 generates an RF phase modulation signal by supplying control signals from two points—charge pump scaling section 36 and modulation amplitude scaling section 37. In this way, a phase modulation apparatus using a 2-point modulation method makes it possible to implement multimode phase modulation covering the range from narrowband to broadband. Patent Document 1: Unexamined Japanese Patent Publication No. 2003-510899

DISCLOSURE OF INVENTION

PROBLEMS TO BE SOLVED BY THE INVENTION

However, with the phase modulation apparatus disclosed in Patent Document 1 above, when a narrow PLL bandwidth is set there is naturally a large modulation area outside the PLL band, and there is consequently a problem of stringent design specifications for VCO 28. Also, when the modulation band differs according to the mode of the communication device, as with a multimode terminal that implements the gamut from narrowband modulation to wideband modulation, if the modulation bandwidth is sufficiently smaller than the PLL bandwidth, for instance, (for example, if sufficiently smaller than the normal PLL bandwidth as in the case of the GSM mode modulation bandwidth), the influence of a signal outside the modulation band is felt when 2-point modulation is used, and therefore a characteristic such as modulation precision (EVM: Error Vector Magnitude) may degrade, for example.

It is an object of the present invention to provide a multimode capable phase modulation apparatus that enables degradation of modulation precision to be reduced, and also enables excessive power consumption to be suppressed, together with a communication device and mobile radio device incorporating that phase modulation apparatus, and a phase modulation method.

Means for Solving the Problems

A phase modulation apparatus of the present invention generates a phase modulation signal by performing phase modulation on an input signal, and has a configuration that includes: a modulation signal generation section that generates a first baseband modulation signal and a second baseband modulation signal based on the input signal; a PLL circuit; and a switching section that switches between having the PLL circuit generate a phase modulation signal by performing 1-point modulation, or generate a phase modulation signal by performing 2-point modulation, by switching between inputting the first baseband modulation signal, or inputting the first baseband modulation signal and the second baseband modulation signal, to the PLL circuit, according to the communication mode.

Also, a phase modulation apparatus of the present invention has a configuration that further includes a determination section that performs a comparative determination of the size relationship of the modulation bandwidth corresponding to the communication mode and the bandwidth of the PLL circuit; wherein the switching section performs switching according to the control signal.

According to such a configuration, the PLL circuit is switched as appropriate between 1-point modulation and 2-point modulation by the switching section according to the communication mode, so that, for example, 1-point modulation is switched to in the case of a communication mode in which the modulation bandwidth is narrower than the PLL bandwidth. As a result, a signal outside the modulation band is not output as a modulation signal, and therefore modulation precision is not degraded, and excess circuitry does not operate, enabling power consumption to be suppressed. On the other hand, in the case of a communication mode in which the modulation bandwidth is wider than the PLL bandwidth, 2-point modulation is switched to. By this means, it is possible to change the PLL bandwidth in the wider direction, reduce noise outside the PLL band, and improve noise characteristics.

ADVANTAGEOUS EFFECT OF THE INVENTION

According to a phase modulation apparatus of the present invention, according to differences of the communication mode of a communication device, switching is performed as appropriate between 1-point modulation and 2-point modulation, and also, the resonance frequency characteristics of a loop filter in the PLL are changed and/or the reference frequency of the PLL is changed, and the PLL bandwidth is optimized. By this means, noise characteristics in effect do not degrade even if the PLL bandwidth is widened (that is, even if wideband modulation is performed). Also, according to a phase modulation apparatus of the present invention, when the modulation bandwidth of a communication device is narrower than the PLL bandwidth, for example, switching to 1-point modulation prevents a signal outside the modulation band from being output as a modulation signal, enabling degradation of modulation precision to be reduced, and also enabling excessive power consumption to be suppressed. As a result, it is possible to provide a multimode capable phase modulation apparatus that allows VCO design specifications to be relaxed, as well as a communication device and mobile radio device incorporating that phase modulation apparatus.

BEST MODE FOR CARRYING OUT THE INVENTION

SUMMARY OF THE INVENTION

Figure 1:
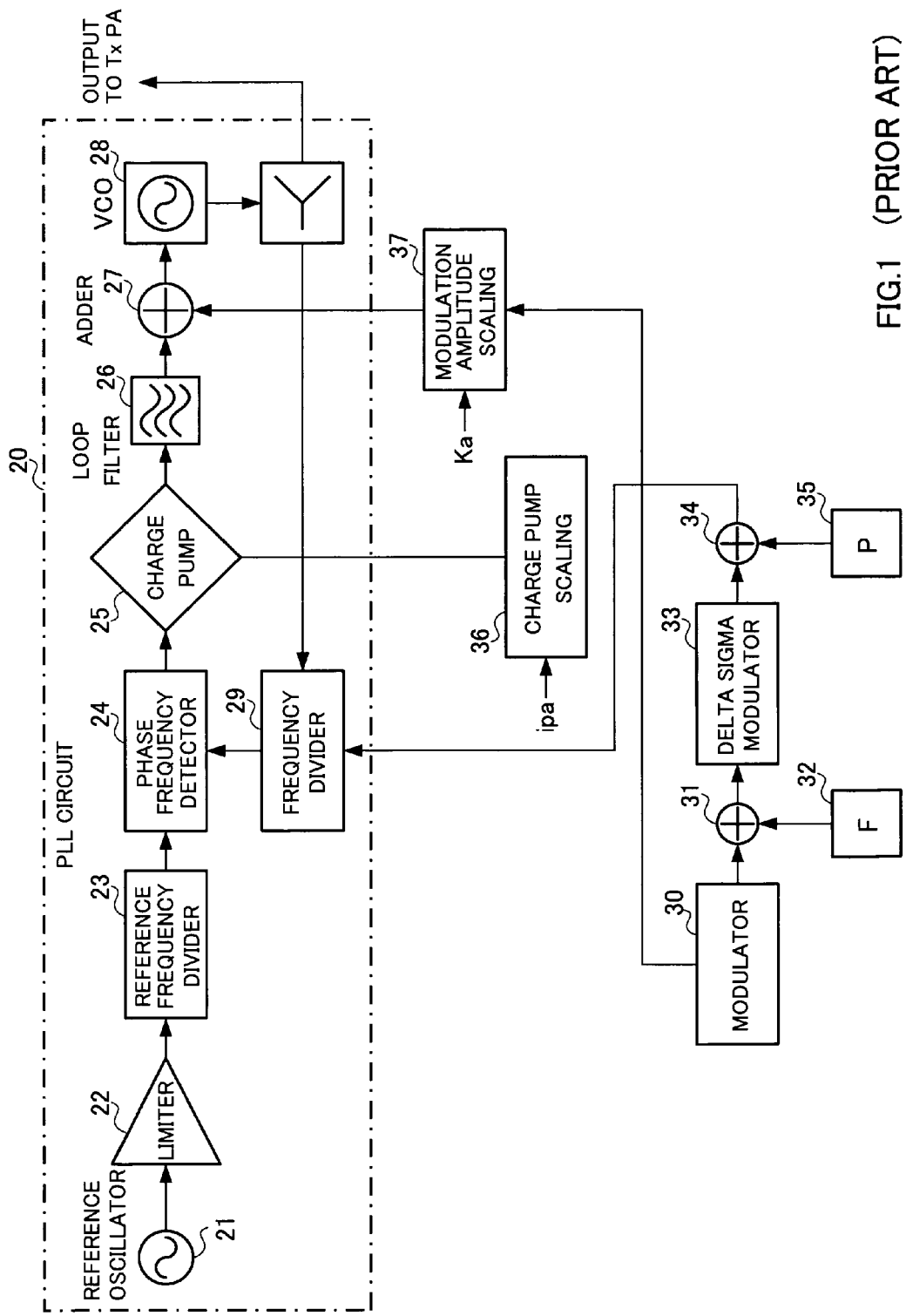
FIG. 1 is a block diagram showing the configuration of a phase modulation apparatus according to the prior art.

A phase modulation apparatus of the present invention is provided in advance with a PLL that has a 2-point modulation method configuration, and has a switching section that is switched between 1-point modulation and 2-point modulation arbitrarily according to a difference of communication mode of a communication device. By this means, in the case of a communication device whose modulation bandwidth is narrowband, 1-point modulation is switched to by the switching section, the PLL bandwidth is made somewhat wider than the modulation bandwidth, and a signal outside the modulation bandwidth is not output as a modulation signal. By preventing a signal outside the modulation bandwidth from being output as a modulation signal in this way, degradation of modulation precision is eliminated and power consumption can be suppressed. On the other hand, in the case of a communication device whose modulation bandwidth is wideband, the PLL bandwidth is changed in the wideband direction by switchover to 2-point modulation by the switching section. Furthermore, by means of the switching section, the resonance frequency characteristics of a loop filter in the PLL are changed and/or the reference frequency of the PLL is increased, and the PLL bandwidth is changed in the wideband direction. By this means, noise outside the PLL band can be reduced and noise characteristics can be improved.

EMBODIMENT 1

Now, preferred embodiments of a phase modulation apparatus according to the present invention will be described in detail with reference to the accompanying drawings. In the drawings used in the embodiments described below, identical configuration elements are assigned the same codes, and duplicate descriptions are omitted wherever possible.

Figure 2:
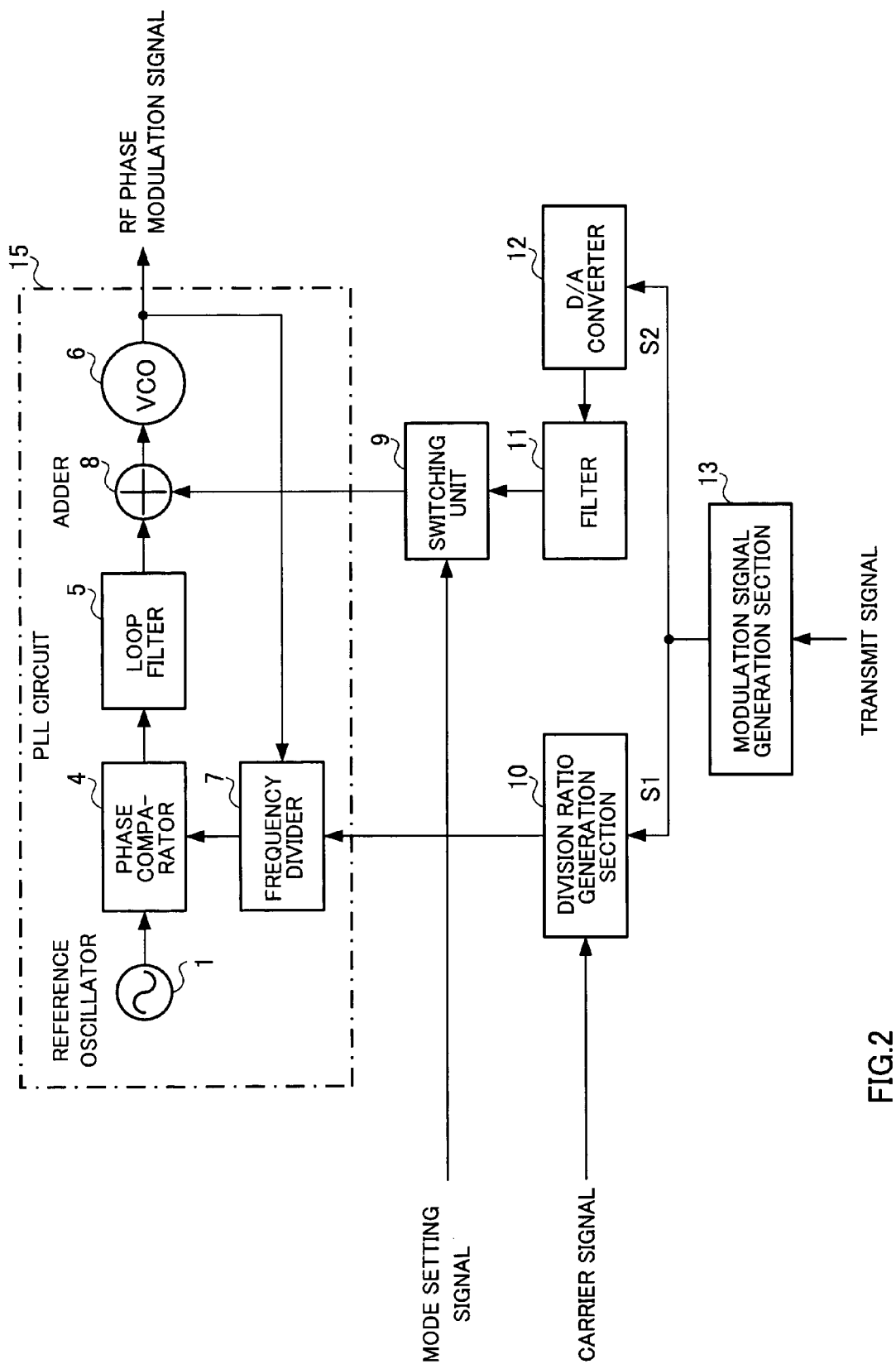
FIG. 2 is a block diagram showing the configuration of a phase modulation apparatus according to Embodiment 1 of the present invention.

FIG. 2 is a block diagram showing the configuration of a phase modulation apparatus according to Embodiment 1 of the present invention. The phase modulation apparatus shown in FIG. 2 has a configuration that includes a PLL circuit 15 that performs phase modulation of a transmit signal, a switching unit (switching section) 9 that performs switching between 1-point modulation and 2-point modulation based on a mode setting signal determined for each mode of a communication device, a division ratio generation section 10 that sets a division ratio based on input of a first digital baseband signal S1 and a carrier signal, and outputs the set division ratio to a frequency divider 7, a filter 11 that removes a high-frequency component from a second digital baseband signal S2 output from a D/A converter 12, D/A converter 12 that converts second digital baseband signal S2 output from a modulation signal generation section 13 to an analog signal, and modulation signal generation section 13 that generates first digital baseband signal S1 and second digital baseband signal S2 based on an input transmit signal.

PLL circuit 15 is composed of a crystal oscillator or suchlike reference oscillator 1 that generates a reference signal, a phase comparator 4 that compares the phase of a signal output from frequency divider 7 with the phase of the reference frequency divider, and outputs a signal in accordance with the phase difference, a loop filter 5 that averages the output signal from phase comparator 4, a VCO 6 that generates and outputs an RF phase modulation signal based on a transmit signal input from modulation signal generation section 13, frequency divider 7 that performs frequency division of an RF modulation signal output from VCO 6, and inputs the resulting signal to phase comparator 4, and an adder 8 that adds an output signal output from filter 11 to an output signal output from loop filter 5.

Next, the operation of the phase modulation apparatus shown in FIG. 2 will be described. As the operations whereby a phase modulation apparatus performs phase modulation of a transmit signal, and generates and outputs an RF phase modulation signal, are well known, descriptions thereof will be omitted as far as possible, and the description will focus on operations whereby switching between 1-point modulation and 2-point modulation is performed according to a mode setting related to the present invention.

VCO 6 of PLL circuit 15 outputs an RF phase modulation signal based on the transmit signal input to modulation signal generation section 13, and the oscillation frequency of this RF phase modulation signal varies according to the voltage input to the control voltage terminal of VCO 6. This kind of control is implemented by having frequency divider 7 divide the frequency of the RF phase modulation signal output from VCO 6 and feed this back to phase comparator 4, having phase comparator 4 compare the phase of the signal input from frequency divider 7 with the phase of reference oscillator 1, and output a signal in accordance with the phase difference to loop filter 5, and having loop filter 5 average the output signal from phase comparator 4 and input the resulting signal to the control voltage terminal of VCO 6.

At this time, when modulation signal generation section 13 generates first digital baseband signal S1 and second digital baseband signal S2 based on the input transmit signal, division ratio generation section 10 sets a division ratio based on first digital baseband signal S1 and carrier signal input, and outputs the set division ratio to frequency divider 7. Frequency divider 7 then generates a modulation signal within the PLL circuit 15 band based on the output signal from division ratio generation section 10. This is the modulation operation by means of the first modulation point.

The transmission route of second digital baseband signal S2 output from modulation signal generation section 13 comprises D/A converter 12 that converts second digital baseband signal S2 from a digital signal to an analog signal, filter 11 that removes a high-frequency component from the output signal output from D/A converter 12, and an adder 8 that adds an output signal output from filter 11 to an output signal output from loop filter 5. The output signal output from filter 11 (that is, second digital baseband signal S2) is then added by adder 8 in PLL circuit 15. By having adder 8 add together the output signal output from loop filter 5 and second digital baseband signal S2 output from filter 11 in this way, modulation outside the PLL circuit 15 band can be applied to the VCO 6 input signal. This is the modulation operation by means of the second modulation point.

Switching unit 9 is provided with a table in which the correspondence between the modulation bandwidth and the mode setting signal is set for each communication mode of the communication device. Therefore, switching unit 9 identifies the modulation bandwidth according to the mode setting signal set for each mode of the communication device, and if that modulation bandwidth is narrower than the PLL bandwidth, turns OFF the second digital baseband signal S2 route. By this means, PLL circuit 15 becomes a 1-point modulation circuit that performs modulation using only first digital baseband signal S1 from division ratio generation section 10. On the other hand, if the modulation bandwidth set according to the communication device mode is wider than the PLL bandwidth, switching unit 9 turns ON the second digital baseband signal S2 route. By this means, PLL circuit 15 becomes a 2-point modulation circuit that performs modulation using first digital baseband signal S1 from division ratio generation section 10 and second digital baseband signal S2 from filter 11.

Figure 3:
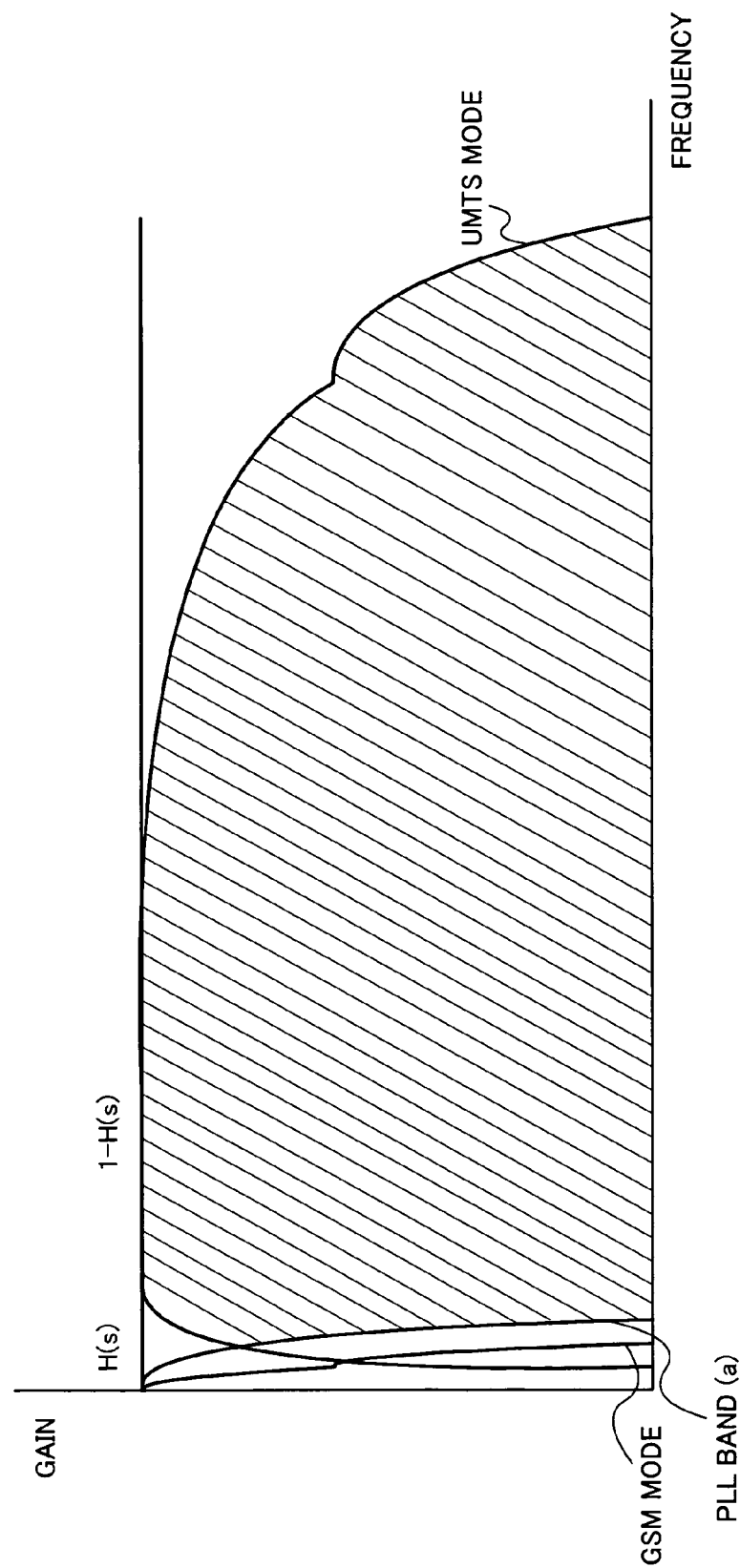
FIG. 3 is a characteristic graph showing the relationship between the modulation bandwidth and PLL bandwidth applied to a phase modulation apparatus according to Embodiment 1 of the present invention.

The nature of the frequency bands switched between for each communication device mode setting will now be explained using the accompanying drawings. FIG. 3 is a characteristic graph showing the relationship between the modulation bandwidth and PLL bandwidth applied to a phase modulation apparatus according to Embodiment 1 of the present invention. In FIG. 3, the horizontal axis indicates frequency, and the vertical axis indicates signal gain. For example, when a multimode phase modulation apparatus is implemented that combines GSM (Global System for Mobile) applied to a TDMA (Time Division Multiple Access) digital mobile phone system and UMTS (Universal Mobile Telecommunication System) applied to a third-generation (3G) mobile communication system, the modulation bandwidth is as shown in FIG. 3, with narrowband modulation performed in GSM mode and wideband modulation performed in UMTS mode.

Since the GSM mode modulation bandwidth is considerably narrower than bandwidth H(s) of PLL band (a), if 2-point modulation is performed PLL bandwidth H(s) becomes still wider and out-of-band modulation is also performed, with the result that characteristics degrade. Therefore, in the case of GSM mode, in which the modulation bandwidth is narrowband, switching unit 9 in FIG. 2 is turned OFF and 1-point modulation is performed using only first digital baseband signal S1, and control is performed so that modulation outside the PLL band is stopped. On the other hand, in UMTS mode, in which the modulation bandwidth is wideband, 2-point modulation comprising PLL circuit 15 in-band modulation and out-of-band modulation is performed using first digital baseband signal S1 and second digital baseband signal S2 by turning switching unit 9 ON, and wideband modulation is implemented.

By switching switching unit 9 so that switching unit 9 is turned OFF and 1-point modulation is performed in the case of narrowband modulation (that is, in GSM mode), and switching unit 9 is turned ON and 2-point modulation is performed in the case of wideband modulation (that is, in UMTS mode), as described above, modulation ranging from narrowband to wideband can be implemented with one circuit. By this means, in 1-point modulation corresponding to narrowband GSM mode, modulation precision can be improved since modulation outside the PLL band is not performed. Furthermore, since 1-point modulation is used, the number of elements operating in the phase modulation apparatus can be reduced, enabling current dissipation to be decreased. Also, in 2-point modulation corresponding to wideband UMTS mode, wideband modulation can be implemented by performing 2-point modulation comprising PLL in-band modulation and out-of-band modulation.

Switching unit 9 that performs switching between 1-point modulation and 2-point modulation need not be a switch. Since adder 8 is used in PLL circuit 15, as shown in FIG. 2, this adder 8 can be employed to switch between 1-point modulation and 2-point modulation. That is to say, if the output of D/A converter 12 is controlled at zero, second digital baseband signal S2 is not added by adder 8, effectively resulting in 1-point modulation, and if the output of D/A converter 12 is controlled normally, second digital baseband signal S2 is added, resulting in 2-point modulation. Thus switching between 1-point modulation and 2-point modulation can also be achieved easily by using this kind of control method.

EMBODIMENT 2

Figure 4:
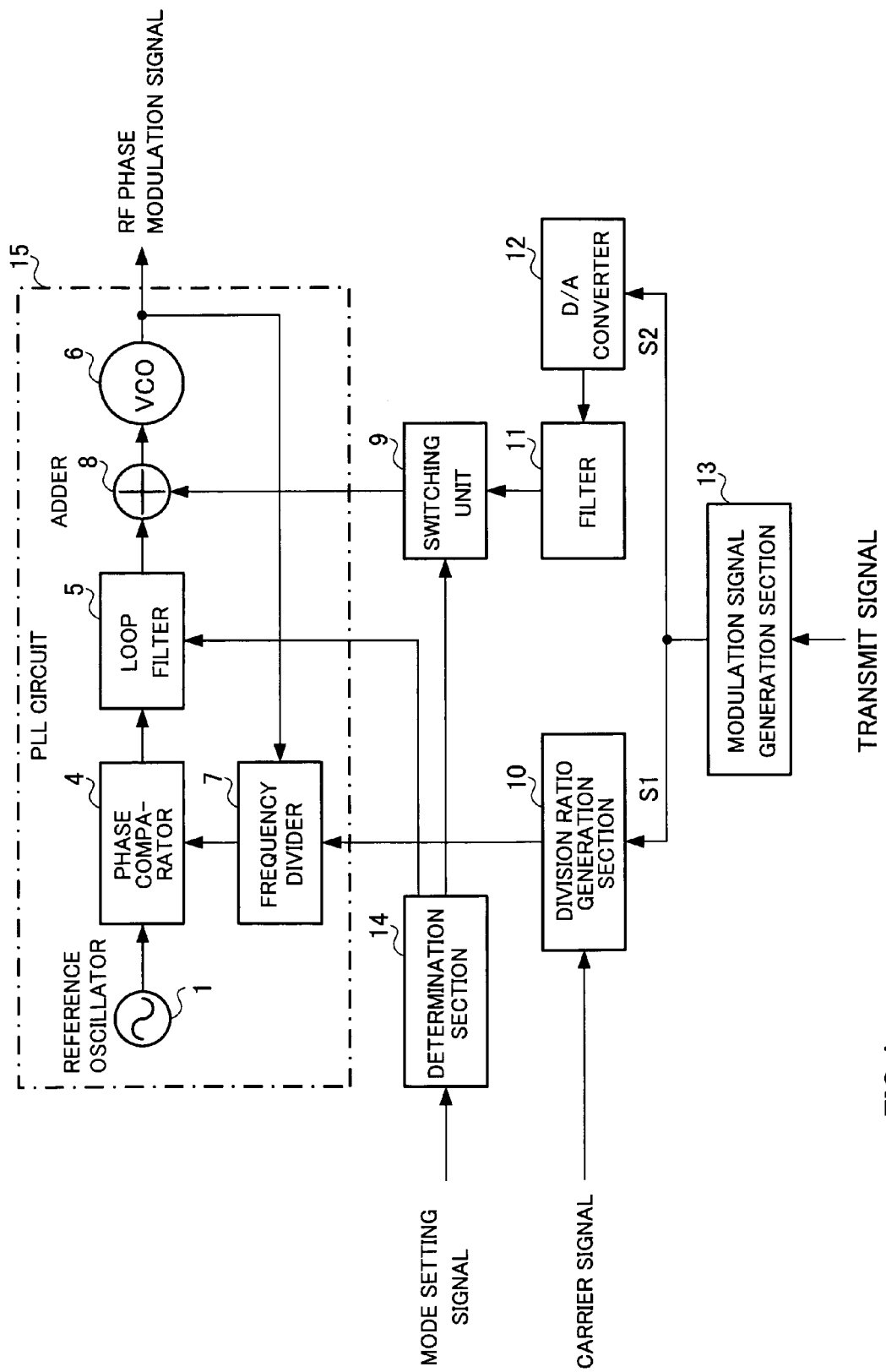
FIG. 4 is a block diagram showing the configuration of a phase modulation apparatus according to Embodiment 2 of the present invention.

FIG. 4 is a block diagram showing the configuration of a phase modulation apparatus according to Embodiment 2 of the present invention. As compared with the phase modulation apparatus of Embodiment 1 shown in FIG. 2, the configuration of a phase modulation apparatus according to Embodiment 2 of the present invention shown in FIG. 4 additionally includes a determination section 14 that identifies a modulation bandwidth corresponding to the mode setting of each communication device and performs ON/OFF switching of switching unit 9, and also sends out a control signal for changing the PLL bandwidth (that is, the loop filter bandwidth). Determination section 14 is provided with a table in which a modulation bandwidth is set for each communication device mode.

Determination section 14 references the table in which a modulation bandwidth is set for each communication device mode, identifies the modulation bandwidth by means of a mode setting signal, and sends control signals to switching unit 9 and loop filter 5. By this means, switching between 1-point modulation and 2-point modulation is performed by turning switching unit 9 ON/OFF according to the communication mode of a communication device, and also, the resonance frequency of loop filter 5 is changed and the bandwidth of PLL circuit 15 is switched.

Figure 5:
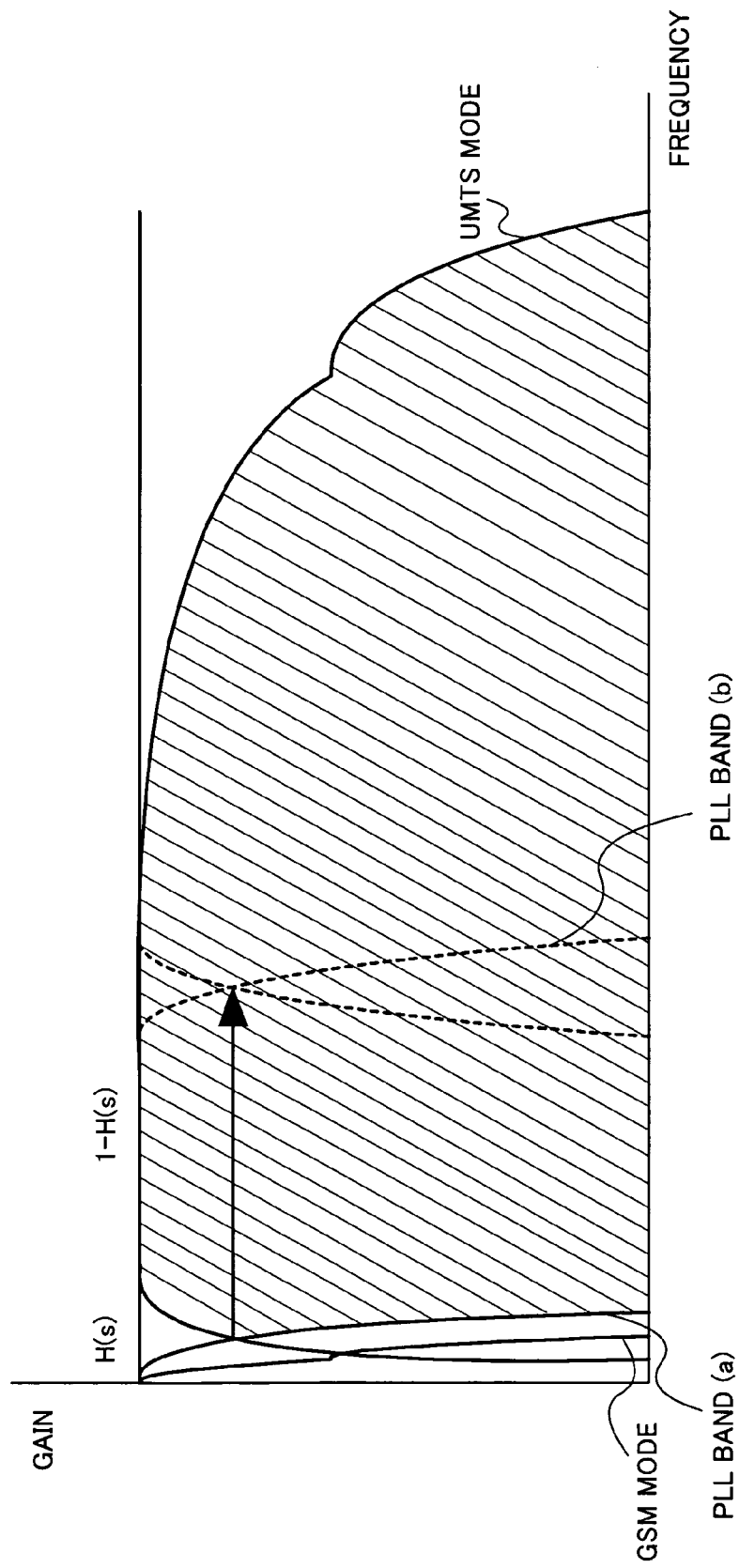
FIG. 5 is a characteristic graph showing the relationship between the modulation bandwidth and PLL bandwidth applied to a phase modulation apparatus according to Embodiment 2 of the present invention.

The operations whereby determination section 14 performs switching control of the bandwidth of PLL circuit 15 according to the communication mode of a communication device are described below. FIG. 5 is a characteristic graph showing the relationship between the modulation bandwidth and PLL bandwidth applied to a phase modulation apparatus according to Embodiment 2 of the present invention, and FIG. 6 is an example of an actual circuit diagram of loop filter 5 for implementing a change of PLL bandwidth in the phase modulation apparatus shown in FIG. 4.

As shown in FIG. 5, when there are two modulation modes, narrowband modulation GSM mode and wideband modulation UMTS mode, the GSM mode narrowband modulation width is considerably narrower than bandwidth H(s) of the PLL band, and therefore if 2-point modulation is performed, out-of-band modulation is also performed, with the result that characteristics degrade. Thus, determination section 14 references the table in which a modulation bandwidth is set for each communication device mode, determines that GSM mode is a mode in which the modulation bandwidth is narrowband, and sends a control signal to switching unit 9 to turn switching unit 9 OFF and perform 1-point modulation so that modulation outside the PLL band is not performed. As a result, narrowband mode 1-point modulation is performed using only first digital baseband signal S1.

Figure 6:
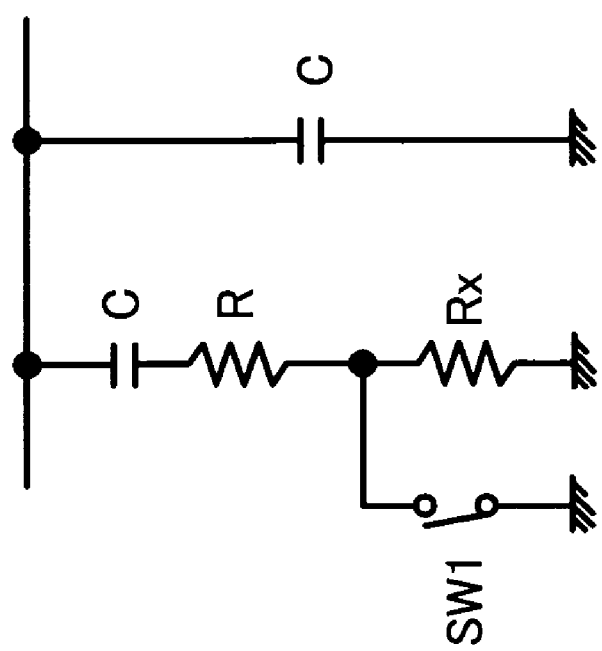
FIG. 6 is an actual circuit diagram showing a sample configuration of a loop filter for implementing a change of PLL bandwidth in Embodiment 2 of the present invention.

At this time, determination section 14 does not send a control signal to loop filter 5, and therefore switch SW1 of the loop filter comprising a series-parallel circuit of capacitors and resistances in FIG. 6 is in the OFF state. Consequently, loop filter 5 has a circuit configuration in which resistance Rx is inserted in series with resistance R, and thus the frequency is lowered, the resonance point is lowered, and the bandwidth is narrowed. Therefore, as regards the bandwidth of PLL circuit 15, bandwidth H(s) becomes narrow as indicated by the PLL band (a) solid line in FIG. 5. However, the bandwidth of PLL band (a) is wider than the GSM mode bandwidth. By thus preventing a signal outside the modulation band from being output as a modulation signal, degradation of modulation precision is eliminated and power consumption can be suppressed.

Also, in wideband modulation UMTS mode, determination section 14 references the table in which a modulation bandwidth is set for each communication device mode, determines that UMTS mode is a mode in which the modulation bandwidth is wideband, and sends a control signal to switching unit 9 to turn switching unit 9 ON and perform 2-point modulation so that modulation outside the PLL band is performed. As a result, wideband mode 2-point modulation is performed using first digital baseband signal S1 and second digital baseband signal S2.

At this time, determination section 14 sends a control signal to loop filter 5, and therefore switch SW1 of the loop filter comprising a series-parallel circuit of capacitors and resistances in FIG. 6 is turned ON. Consequently, loop filter 5 has a circuit configuration in which resistance Rx is shorted, and thus the frequency rises, the resonance point rises, and the bandwidth is widened. Therefore, as regards the bandwidth of PLL circuit 15 shown in FIG. 5, the bandwidth widens in the direction indicated by the arrow from the PLL band (a) solid line to the PLL band (b) indicated by a dotted line. By thus performing control so that switching unit 9 is turned ON in wideband modulation UMTS mode, control is implemented so that 2-point modulation is switched to and the resonance point of loop filter 5 is changed, and PLL bandwidth H(s) is made wider than in GSM mode.

By turning ON switch SW1 in FIG. 6 and changing the resistance value in wideband modulation UMTS mode as described above, thereby making the modulation area outside the PLL band (that is, the area of the hatched part in FIG. 5) smaller, the effects of characteristic degradation due to VCO 6 sensitivity and linearity are reduced, enabling VCO 6 to be given a noise margin, and as a result, making it possible to relax the VCO design specifications.

EMBODIMENT 3

Figure 7:
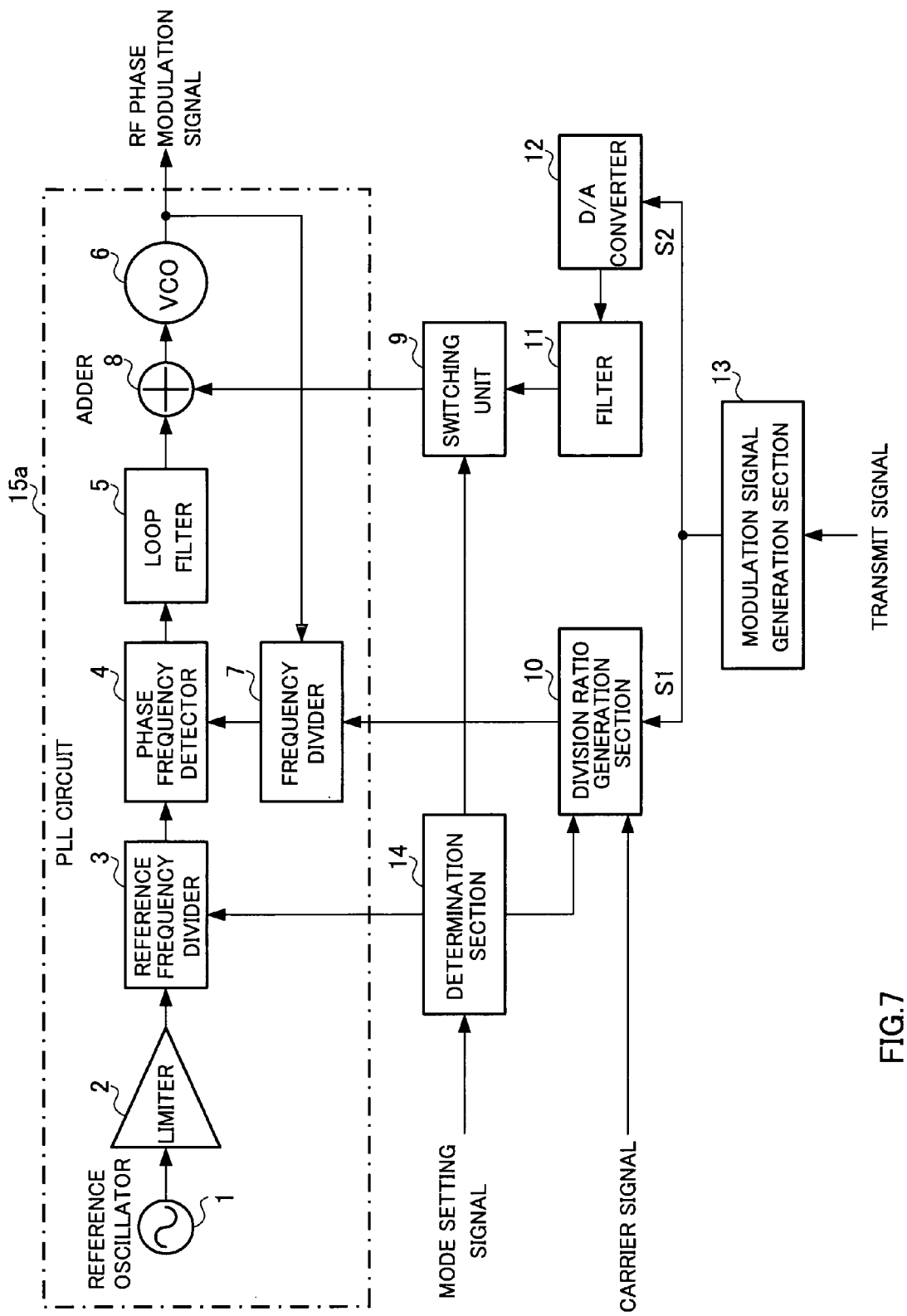
FIG. 7 is a block diagram showing the configuration of a phase modulation apparatus according to Embodiment 3 of the present invention.

FIG. 7 is a block diagram showing the configuration of a phase modulation apparatus according to Embodiment 3 of the present invention. As compared with the phase modulation apparatus of Embodiment 2 shown in FIG. 4, the configuration of a phase modulation apparatus according to Embodiment 3 of the present invention shown in FIG. 7 additionally includes a limiter 2 that sends a reference signal of reference oscillator 1 to a reference frequency divider 3, and reference frequency divider 3 that performs frequency division and frequency multiplication of the reference signal and outputs the resulting signal to phase comparator 4 as a reference signal. Therefore, in FIG. 7, limiter 2 and reference frequency divider 3 have been added to the configuration of PLL circuit 15 in FIG. 2 and FIG. 4, and the PLL circuit reference code has been changed to 15a.

In FIG. 7, determination section 14 is provided with a table in which a modulation bandwidth is set for each communication device mode, references this table and identifies the modulation bandwidth by means of a mode setting signal, and sends control signals to switching unit 9, division ratio generation section 10, and reference frequency divider 3. By this means, switching between 1-point modulation and 2-point modulation is performed by turning switching unit 9 ON/OFF according to the communication device mode, and also, the division ratio of division ratio generation section 10 and the frequency of the reference frequency division signal of reference frequency divider 3 are changed, and the bandwidth of PLL circuit 15a is altered.

The operations whereby determination section 14 performs switching between 1-point modulation and 2-point modulation by turning switching unit 9 ON/OFF according to the communication device mode are the same as in above-described Embodiment 1 and Embodiment 2, and therefore a description thereof is omitted here. In Embodiment 3, determination section 14 further references the table in which a modulation bandwidth is set for each communication mode, identifies the modulation bandwidth by means of a mode setting signal, and changes the reference oscillation frequency of reference frequency divider 3 output and the division ratio of division ratio generation section 10, and alters the PLL bandwidth, in performing modulation.

For example, when there are two modulation modes, narrowband modulation GSM mode and wideband modulation UMTS mode, as shown in FIG. 5, the GSM mode bandwidth is considerably narrower than PLL bandwidth H(s), and therefore if 2-point modulation is performed, out-of-band modulation is also performed, with the result that characteristics degrade. Therefore, switching unit 9 is turned OFF and 1-point modulation is performed so that modulation outside the PLL band is not performed.

At this time, determination section 14 does not send a control signal to reference frequency divider 3 or division ratio generation section 10, and therefore the operating frequency of PLL circuit 15a does not change, and as regards the bandwidth of PLL 15a, bandwidth H(s) becomes narrow as indicated by the PLL band (a) solid line in FIG. 5. However, the bandwidth of PLL band (a) is wider than the GSM mode modulation bandwidth. By thus preventing a signal outside the modulation band from being output as a modulation signal, degradation of modulation precision is eliminated and power consumption can be suppressed.

Also, in wideband modulation UMTS mode, determination section 14 sends a control signal to turn switching unit 9 ON, and switches to 2-point modulation. Furthermore, determination section 14 sends control signals to reference frequency divider 3 and division ratio generation section 10, increases the frequency of the reference oscillation output from reference frequency divider 3 and also increases the division ratio of division ratio generation section 10, thereby increasing the operating frequency of PLL circuit 15a and widening bandwidth H(s) of PLL circuit 15a as indicated by the dotted line marked PLL band (b). By increasing the reference oscillation frequency of PLL circuit 15a in wideband modulation UMTS mode as described above, the bandwidth of PLL circuit 15a can be made wider than when switching unit 9 is OFF, therefore modulating outside the PLL band can be reduced, and the effects of characteristic degradation due to VCO 6 sensitivity and linearity are reduced, enabling VCO 6 design specifications to be relaxed.

EMBODIMENT 4

In Embodiment 4, a case is described in which three PLL bandwidths are set, switching among three communication modes. Here, the three communication modes for which setting switching is described are the above-described GSM mode, Bluetooth mode used in systems for radio data transfer between mobile devices, and the above-described UMTS mode.

Figure 8:
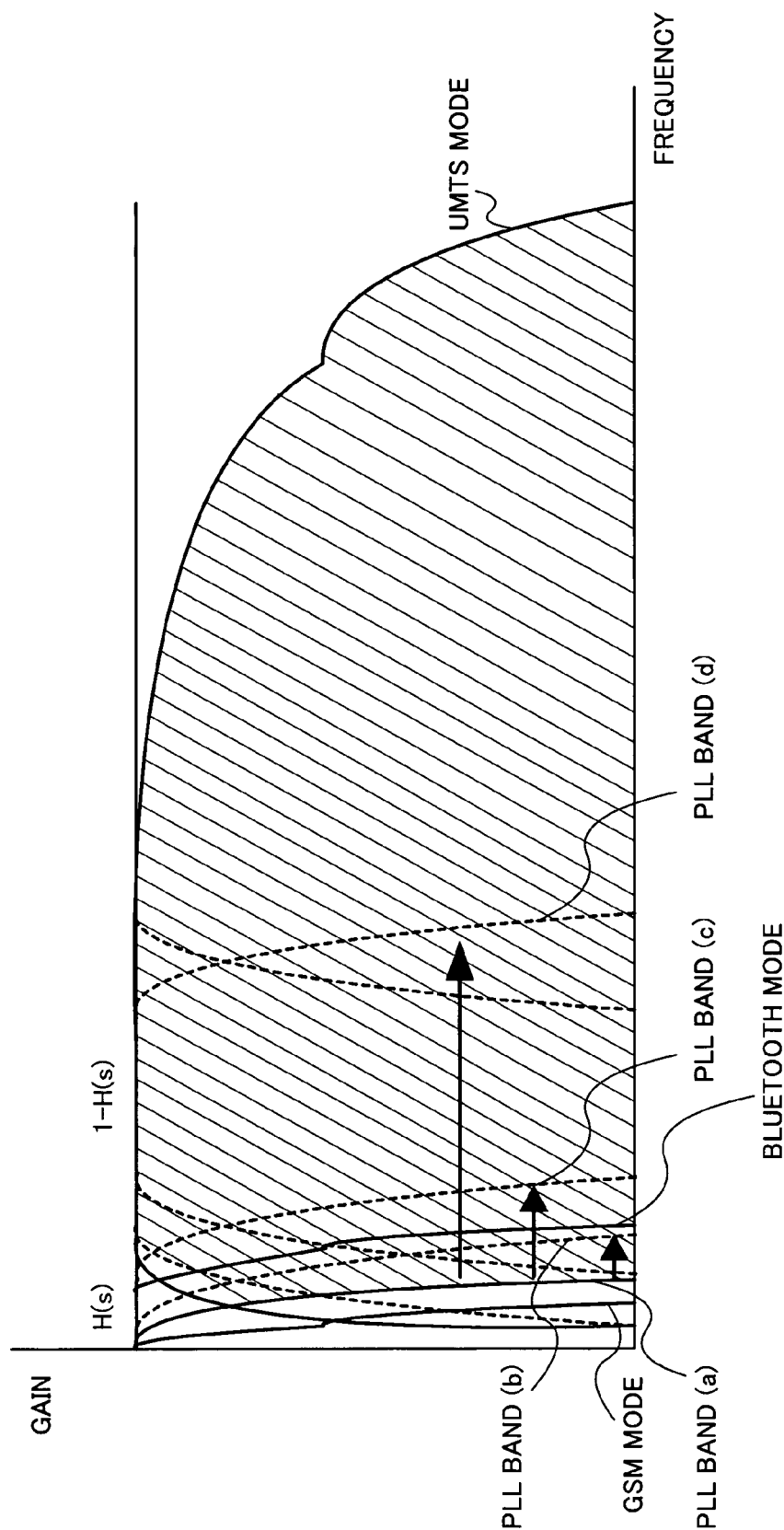
FIG. 8 is a characteristic graph showing the relationship between the modulation bandwidth and PLL bandwidth applied to a phase modulation apparatus according to Embodiment 4 of the present invention.
Figure 9:
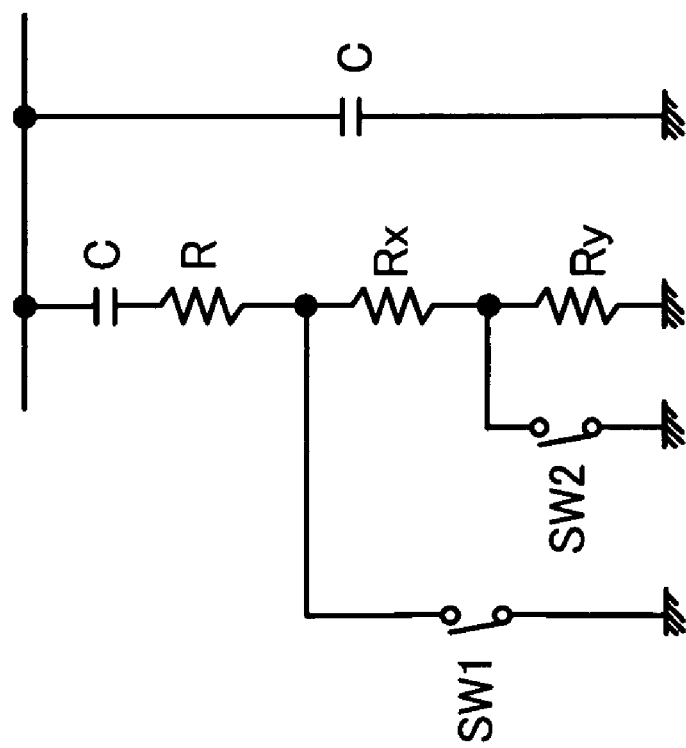
FIG. 9 is an actual circuit diagram showing a sample configuration of a loop filter for implementing a change of PLL bandwidth in Embodiment 4 of the present invention.

FIG. 8 is a characteristic graph showing the relationship between the modulation bandwidth and PLL bandwidth applied to a phase modulation apparatus according to Embodiment 4 of the present invention, and FIG. 9 is an example of a circuit diagram that implements a change of PLL bandwidth in Embodiment 4 of the present invention. Operations whereby the PLL bandwidth is switched optimally for each communication mode are described below using FIG. 8 and FIG. 9.

In GSM mode, which has the narrowest band, the modulation bandwidth is considerably narrower than the PLL bandwidth, and therefore if 2-point modulation is performed, out-of-band modulation is also performed, with the result that characteristics degrade. Therefore, 1-point modulation is selected by turning switching unit 9 in FIG. 4 OFF so that modulation outside the PLL band is not performed. As a result, the bandwidth of PLL 15 becomes PLL band (a) indicated by a solid line in FIG. 8, and the PLL bandwidth is somewhat wider than the GSM mode modulation bandwidth. At this time, GSM modulation precision improves since modulation outside the PLL band is not performed, and few elements operate since 1-point modulation is used, reducing power consumption.

In Bluetooth mode, which covers a somewhat wider band than GSM mode, 2-point modulation is switched to by performing control so that switching unit 9 in FIG. 4 is turned ON, control is performed so that the PLL bandwidth is made wider than in GSM mode, and the PLL bandwidth is as indicated by the PLL band (b) dotted line in FIG. 8. However, since PLL band (b) is narrower than the Bluetooth mode modulation bandwidth, switch SW1 of the loop filter in FIG. 9 is turned OFF, and a switch SW2 is turned ON. As a result, series resistance Ry is shorted, the resonance frequency increases, and the PLL bandwidth widens and becomes the PLL band (c) PLL bandwidth as indicated by a dotted line in FIG. 8. That is to say, with the change to PLL band (c), the PLL bandwidth becomes wider than the Bluetooth mode modulation bandwidth, and decreasing the area of modulation outside the PLL band reduces the effects of characteristic degradation due to VCO 6 sensitivity and linearity, enabling the VCO 6 design specifications to be relaxed.

In UMTS mode, which has the widest band, 2-point modulation is left set by leaving switching unit 9 in FIG. 4 turned ON, and switch SW1 of the loop filter in FIG. 9 is turned ON. At this time, it does not matter whether switch SW2 is ON or OFF. As a result, series resistances Ry and Rx are shorted and the resonance frequency further increases, and the PLL bandwidth widens further to cover PLL band (d) as indicated by a dotted line in FIG. 8. By performing control so that the PLL bandwidth is made wider in UMTS mode than in Bluetooth mode as described above, thereby decreasing the area of modulation outside the PLL band (that is, making the area of the hatched part in FIG. 8 smaller), the effects of characteristic degradation due to VCO 6 sensitivity and linearity can be reduced, and as a result, the VCO 6 design specifications can be relaxed.

In Bluetooth mode, even if switching unit 9 in FIG. 4 is turned OFF and 1-point modulation is switched to, the PLL bandwidth can be widened as indicated by PLL band (c) by turning ON switch SW1 of the loop filter in FIG. 9. As a result, the PLL bandwidth becomes wider than the Bluetooth mode modulation bandwidth, and decreasing the area of modulation outside the PLL band reduces the effects of characteristic degradation due to VCO 6 sensitivity and linearity, enabling the VCO 6 design specifications to be relaxed. The relationship between the modulation bandwidth and PLL bandwidth is determined as appropriate according to the relationship between the VCO characteristics and noise outside the PLL band.

EMBODIMENT 5

Figure 10:
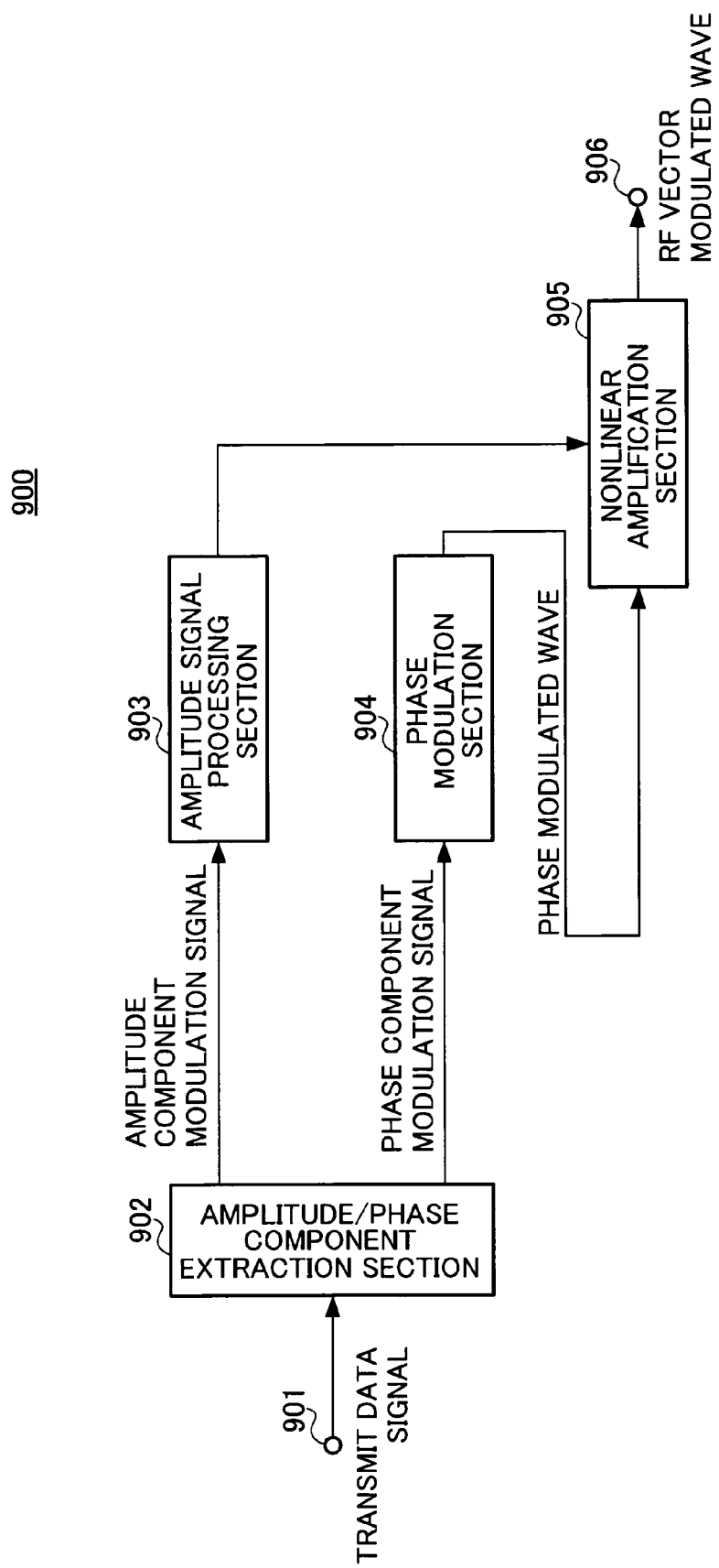
FIG. 10 is a block diagram showing a sample configuration of a transmitting apparatus incorporating a phase modulation apparatus of the present invention.

In Embodiment 5, a phase modulation apparatus as described in the above embodiments can also be applied to a configuration incorporated in a communication device or mobile radio device (such as a mobile phone or the like), a portable communication terminal such as a notebook-type personal computer, or a communication apparatus such as a radio base station. FIG. 10 is a block diagram showing a sample configuration of a transmitting apparatus incorporating a phase modulation apparatus of the present invention. Transmitting apparatus 900 has a configuration that includes a transmit data signal input terminal 901, an amplitude/phase component extraction section 902, an amplitude signal processing section 903, a phase modulation section 904, a nonlinear amplification section 905, and a transmission output terminal 906. In this case, a phase modulation apparatus according to any of the above-described embodiments can be installed in phase modulation section 904.

When a transmit data signal is input from transmit data signal input terminal 901, an amplitude component modulation signal and a phase component modulation signal are extracted from the transmit data signal by amplitude/phase component extraction section 902. Then the power supply voltage value of nonlinear amplification section 905 is set via amplitude signal processing section 903 according to the amplitude component modulation signal. Also, a phase modulated wave in which a carrier having an angular frequency is phase modulated by the phase component modulation signal is generated by phase modulation section 904, and input to nonlinear amplification section 905.

Then a signal obtained by multiplying together the nonlinear amplification section 905 power supply voltage value, and the phase modulated wave that is the output signal from phase modulation section 904, is amplified by gain G of nonlinear amplification section 905, and output in the nonlinear amplification section 905 output as an RF vector modulated wave (RF modulation signal). Since the modulated wave input to nonlinear amplification section 905 is a phase modulated wave that is a modulated wave of a fixed envelope level, a highly efficient nonlinear amplifier can be used as a high-frequency amplifier. Such a configuration enables a small, low-cost transmitting apparatus 900 to be implemented.

Figure 11:
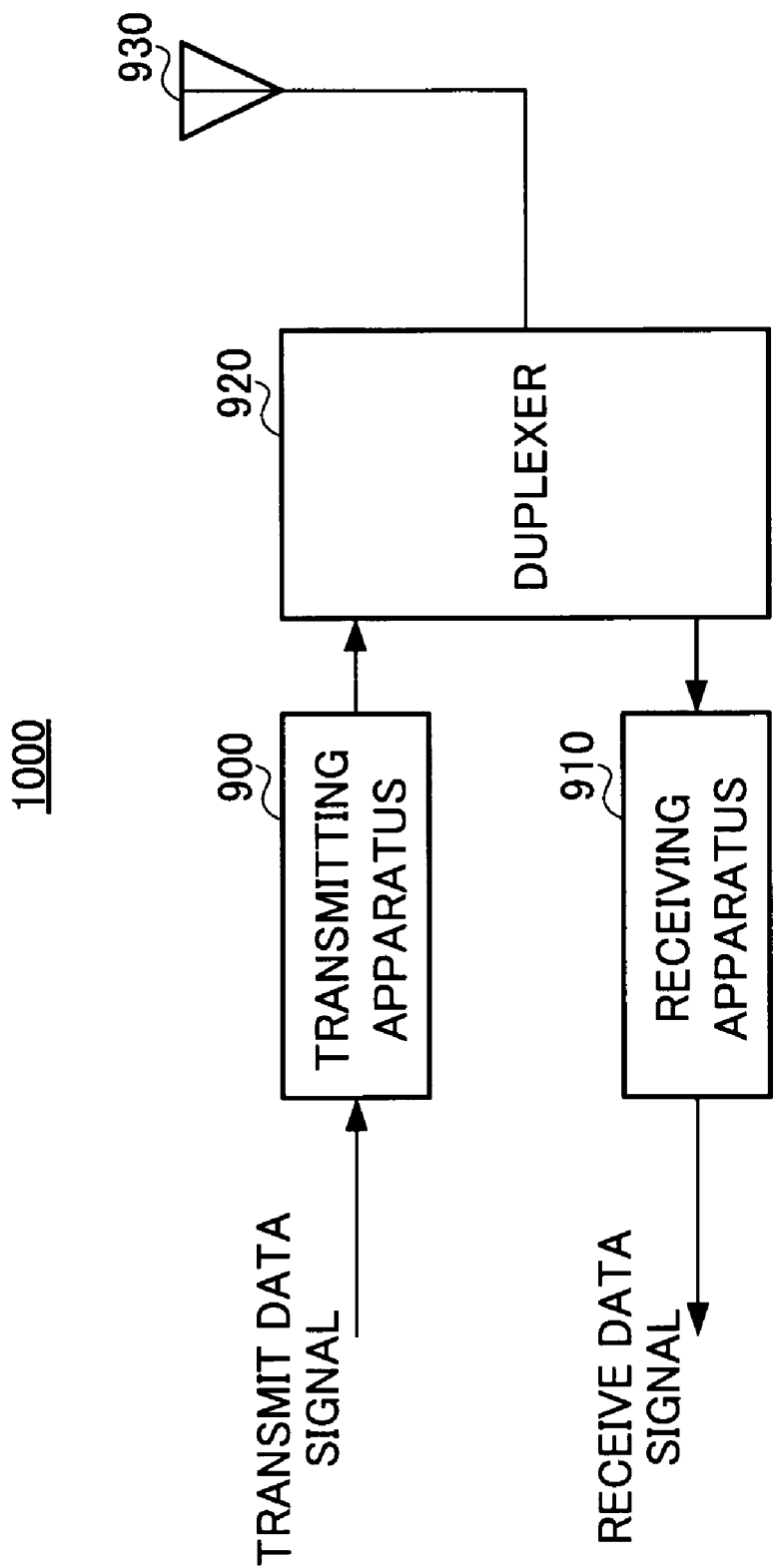
FIG. 11 is a block diagram showing a sample configuration of a communication device incorporating a phase modulation apparatus of the present invention.

FIG. 11 shows the general configuration of a communication device incorporating a phase modulation apparatus of the present invention. Communication device 1000 is equipped with a transmitting apparatus 900 incorporating a phase modulation apparatus of the present invention, a receiving apparatus 910 that obtains a receive data signal by executing predetermined reception processing including demodulation processing on a received signal, a duplexer 920 that performs switching between a transmit signal and received signal, and an antenna 930.

A phase modulation apparatus of the present invention is provided in communication device 1000 of this embodiment as described above. As described in the above embodiments, a phase modulation apparatus of the present invention can achieve an improvement in noise characteristics and also suppress power consumption, and therefore using a communication device that employs this phase modulation apparatus has an effect of enabling a high-quality signal to be transmitted while keeping power consumption low when performing multimode compatible transmission.

As described above, according to one aspect of a phase modulation apparatus of the present invention, the phase modulation apparatus generates a phase modulation signal by performing phase modulation on an input signal, and has a configuration that includes: a modulation signal generation section that generates a first baseband modulation signal and a second baseband modulation signal based on the input signal; a PLL circuit; and a switching section that switches between having the PLL circuit generate a phase modulation signal by performing 1-point modulation, or generate a phase modulation signal by performing 2-point modulation, by switching between inputting the first baseband modulation signal, or inputting the first baseband modulation signal and the second baseband modulation signal, to the PLL circuit, according to the communication mode.

Also, according to one aspect of a phase modulation apparatus of the present invention, the phase modulation apparatus has a configuration that further includes a determination section that performs a comparative determination of the size relationship of modulation bandwidth according to the communication mode and the bandwidth of the PLL circuit; wherein the switching section performs switching according to the control signal.

According to such a configuration, the PLL circuit is switched as appropriate between 1-point modulation and 2-point modulation by the switching section according to the communication mode, so that, for example, 1-point modulation is switched to in the case of a communication mode in which the modulation bandwidth is narrower than the PLL bandwidth. As a result, a signal outside the modulation band is not output as a modulation signal, and therefore modulation precision is not degraded, and excess circuitry does not operate, enabling power consumption to be suppressed. On the other hand, in the case of a communication mode in which the modulation bandwidth is wider than the PLL bandwidth, 2-point modulation is switched to. By this means, it is possible to change the PLL bandwidth in the wider direction, reduce noise outside the PLL band, and improve noise characteristics.

Also, according to one aspect of a phase modulation apparatus of the present invention, the phase modulation apparatus has a configuration wherein the determination section sends a control signal to a loop filter that is a component of the PLL circuit; and the loop filter changes its own resonance frequency based on the control signal sent from the determination section, and changes the bandwidth of the PLL circuit.

According to this configuration, the resonance frequency of the loop filter can be varied, and the bandwidth of the PLL circuit changed, according to a control signal corresponding to the communication mode. For example, when the modulation bandwidth of the communication mode is wider than the PLL bandwidth, the resonance frequency of the loop filter is increased by a control signal, and the PLL circuit bandwidth is changed in the wideband direction. By this means, degradation of noise characteristics in a wideband communication mode can be prevented. Therefore, the design specifications of a voltage controlled oscillator that is a component of the PLL circuit can be relaxed.

Also, according to one aspect of a phase modulation apparatus of the present invention, the phase modulation apparatus has a configuration wherein the determination section sends the control signal to a reference frequency divider that provides a reference signal to a phase comparator of the PLL circuit and a division ratio generation section that generates the division ratio of the PLL circuit, changes the oscillation frequency of the reference frequency divider and the division ratio of the division ratio generation section, and changes the bandwidth of the PLL circuit.

According to this configuration, it is possible to vary the oscillation frequency of the reference frequency divider that is a component of the PLL circuit, and the division ratio of the division ratio generation section, and change the bandwidth of the PLL circuit. For example, when the modulation bandwidth of the communication mode is wider than the PLL bandwidth, the oscillation frequency of the reference frequency divider is increased by a control signal, and the PLL circuit bandwidth is changed in the wideband direction. By this means, degradation of noise characteristics in a wideband communication mode can be prevented. Therefore, the design specifications of a voltage controlled oscillator that is a component of the PLL circuit can be relaxed.

Also, according to one aspect of a phase modulation apparatus of the present invention, the phase modulation apparatus has a configuration wherein the communication modes are of two kinds, GSM mode and UMTS mode; and the determination section sends a control signal to the switching section so that 1-point modulation is performed in the GSM mode, and sends a control signal to the switching section so that 2-point modulation is performed in the UMTS mode.

According to this configuration, in narrowband GSM mode, 1-point modulation is performed, and therefore modulation precision can be improved since modulation outside the PLL band is not performed. Also, since 1-point modulation is performed, few elements operate, and current dissipation can be reduced. Furthermore, in wideband UMTS mode, 2-point modulation is performed, and therefore wideband modulation can be implemented by performing 2-point modulation comprising PLL in-band modulation and out-of-band modulation.

Also, according to one aspect of a phase modulation apparatus of the present invention, the phase modulation apparatus has a configuration wherein the communication modes are of two kinds, GSM mode and UMTS mode; and the determination section sends a control signal to the switching section so that 1-point modulation is performed in the GSM mode; and in the UMTS mode, sends a control signal to the switching section so that 2-point modulation is performed, and also sends a control signal to the loop filter and changes the bandwidth of the PLL circuit in the wideband direction.

According to this configuration, in wideband UMTS mode, 2-point modulation is performed, the resonance frequency of the loop filter is increased, and the bandwidth of the PLL circuit is changed in the wideband direction. By this means, degradation of noise characteristics in a wideband communication mode can be prevented.

Also, according to one aspect of a phase modulation apparatus of the present invention, the phase modulation apparatus has a configuration wherein the communication modes are of three kinds, GSM mode, Bluetooth mode, and UMTS mode; and the determination section sends a control signal to the switching section so that 1-point modulation is performed in the GSM mode; and in the Bluetooth mode, sends a control signal to the switching section so that 2-point modulation is performed, and also sends a control signal to the loop filter and changes the bandwidth of the PLL circuit in the wideband direction; and in the UMTS mode, sends a control signal to the switching section so that 2-point modulation is performed, and also sends a control signal to the loop filter and changes the bandwidth of the PLL circuit further in the wideband direction than in the case of the Bluetooth mode.

According to this configuration, in GSM mode, which has the narrowest band, 1-point modulation is performed and the PLL bandwidth is made somewhat wider than the GSM mode modulation bandwidth. In Bluetooth mode, in which the bandwidth is somewhat wider than in GSM mode, 2-point modulation is performed, and also the resonance frequency of the loop filter is increased and the PLL bandwidth is made somewhat wider than the Bluetooth mode modulation bandwidth. Furthermore, in UMTS mode, which has the widest band, 2-point modulation is performed, and also the resonance frequency of the loop filter is further increased and the PLL bandwidth is widened further than in Bluetooth mode. By this means, wideband modes can be catered for simply by performing switching according to the communication mode using a single phase modulation apparatus.

According to the present invention, it is also possible to implement a communication device or mobile radio device incorporating a phase modulation apparatus of any of the above-described embodiments.

According to this configuration, it is possible to provide a communication device or mobile radio device incorporating a multimode capable phase modulation apparatus that enables VCO design specifications to be relaxed.

Also, according to one aspect of a phase modulation method of the present invention, the phase modulation method generates a phase modulation signal by performing phase modulation on a transmit signal, and includes: a step of performing a comparative determination of the size relationship of the modulation bandwidth of the communication mode and the bandwidth of the PLL circuit; a step of switching the PLL circuit to 1-point modulation when the modulation bandwidth of the communication mode is narrowband compared with the bandwidth of the PLL circuit, and switching the PLL circuit to 2-point modulation when the modulation bandwidth of the communication mode is wideband compared with the bandwidth of the PLL circuit; and a step of, when the PLL circuit is switched to 2-point modulation, changing the resonance frequency of the loop filter of that PLL circuit and changing the bandwidth of the PLL circuit in the wideband direction.

Furthermore, according to one aspect of a phase modulation method of the present invention, the phase modulation method generates a phase modulation signal by performing phase modulation on a transmit signal, and includes: a step of performing a comparative determination of the size relationship of the modulation bandwidth of the communication mode and the bandwidth of the PLL circuit; a step of switching the PLL circuit to 1-point modulation when the modulation bandwidth of the communication mode is narrowband compared with the bandwidth of the PLL circuit, and switching the PLL circuit to 2-point modulation when the modulation bandwidth of the communication mode is wideband compared with the bandwidth of the PLL circuit; and a step of, when the PLL circuit is switched to 2-point modulation, changing the reference frequency of that PLL circuit and changing the bandwidth of the PLL circuit in the wideband direction.

The present application is based on Japanese Patent Application No. 2004-373801 filed on Dec. 24, 2004, entire content of which is expressly incorporated herein by reference.

INDUSTRIAL APPLICABILITY

A phase modulation apparatus according to the present invention can improve modulation precision, and also achieve low power consumption and multimode operation, by performing a change of bandwidth of a loop filter in a PLL circuit, a change of reference oscillation frequency in the PLL circuit, and switching between 1-point modulation and 2-point modulation, as a result of which VCO design specifications can be relaxed, and is therefore suitable for use as a phase modulation apparatus incorporated in a portable communication terminal such as a mobile phone, radio communication device, notebook-type personal computer, or the like, or a communication apparatus such as a mobile communication device or radio base station.

The invention claimed is:

1. A phase modulation apparatus that generates a phase modulation signal by performing phase modulation on an input signal, said phase modulation apparatus comprising:
 a modulation signal generation section that generates a first baseband modulation signal and a second baseband modulation signal based on said input signal;
 a phase locked loop circuit; and
 a switching section that switches between having said phase locked loop circuit generate a phase modulation signal by performing 1-point modulation and generate a phase modulation signal by performing 2-point modulation, by switching between inputting said first baseband modulation signal and inputting said first baseband modulation signal and said second baseband modulation signal, to said phase locked loop circuit, according to a communication mode setting signal that is inputted identifying one of a plurality of communication system modes.

2. The phase modulation apparatus according to claim 1, further comprising a determination section that performs a comparative determination of a size relationship of a modulation bandwidth corresponding to said communication mode setting signal and a bandwidth of said phase locked loop circuit, and that sends a first control signal according to a result of determination, to said switching section,
 wherein said switching section performs switching according to said first control signal.

3. The phase modulation apparatus according to claim 2, wherein:
 said determination section sends a second control signal based on said modulation bandwidth corresponding to said communication mode setting signal to a loop filter that is a component of said phase locked loop circuit; and
 said loop filter changes its own resonance frequency based on said second control signal sent from said determination section, and changes said bandwidth of said phase locked loop circuit.

4. The phase modulation apparatus according to claim 3, wherein said determination section sends said second control signal based on said modulation bandwidth corresponding to said communication mode setting signal to a reference frequency divider that provides a reference signal to a phase comparator of said phase locked loop circuit and a division ratio generation section that generates a division ratio of said phase locked loop circuit, changes an oscillation frequency of said division ratio generation section, and changes said bandwidth of said phase locked loop circuit.

5. The phase modulation apparatus according to claim 2, wherein:
 said communication system modes comprise two kinds communication modes represented by a global system for mobile mode and a universal mobile telecommunication system mode; and
 said determination section sends a control signal as said first control signal to said switching section so that 1-point modulation is performed in said global system for mobile mode, and sends a control signal as said first control signal to said switching section so that 2-point modulation is performed in said universal mobile telecommunication system mode.

6. The phase modulation apparatus according to claim 2, wherein:
 said communication system modes comprise two kinds communication modes represented by a global system for mobile mode and a universal mobile telecommunication system mode; and
 said determination section sends a control signal as said first control signal to said switching section so that 1-point modulation is performed in said global system for mobile mode, and in said universal mobile telecommunication system mode, sends a control signal as said first control signal to said switching section so that 2-point modulation is performed, and also sends said second control signal to a loop filter and changes said bandwidth of said phase locked loop circuit in a wideband direction.

7. The phase modulation apparatus according to claim 3, wherein:
 said communication system modes comprise three kinds of communication modes represented by a global system for mobile mode, a wireless personal area network mode, and a universal mobile telecommunication system mode; and
 said determination section sends a control signal to said switching section so that 1-point modulation is performed in said global system for mobile mode, in said wireless personal area network mode, sends a control signal to said switching section so that 2-point modulation is performed, and also sends said second control signal to said loop filter and changes said bandwidth of said phase locked loop circuit in a wideband direction; and in said universal mobile telecommunication system mode, sends a control signal to said switching section so that 2-point modulation is performed, and also sends said second control signal to said loop filter and changes said bandwidth of said phase locked loop circuit further in a wideband direction than in case of said wireless personal area network mode.

8. A communication device that incorporates the phase modulation apparatus according to claim 1.

9. A mobile radio device that incorporates the phase modulation apparatus according to claim 1.

10. A phase modulation method that generates a phase modulation signal by performing phase modulation on a transmit signal, said phase modulation method comprising:
 a step of inputting a communication mode setting signal identifying one of a plurality of communication system modes and performing a comparative determination of a size relationship of a modulation bandwidth corresponding to said communication mode setting signal and a bandwidth of a phase locked loop circuit;
 a step of switching said phase locked loop circuit to 1-point modulation when said modulation bandwidth corresponding to said communication mode setting signal is narrowband compared with said bandwidth of said phase locked loop circuit, and switching said phase locked loop circuit to 2-point modulation when a modulation bandwidth corresponding to said communication mode setting signal is wideband compared with said a bandwidth of said phase locked loop circuit; and
 a step of, when said phase locked loop circuit is switched to 2-point modulation, changing a resonance frequency of a loop filter of that phase locked loop circuit and changing a bandwidth of said phase locked loop circuit in a wideband direction.

11. A phase modulation method that generates a phase modulation signal by performing phase modulation on a transmit signal, said phase modulation method comprising:
 a step of inputting a communication mode setting signal identifying one of a plurality of communication system modes and performing a comparative determination of a size relationship of a modulation bandwidth corresponding to said communication mode setting and a bandwidth of a phase locked loop circuit;

a step of switching said phase locked loop circuit to 1-point modulation when a modulation bandwidth corresponding to said communication mode setting signal is narrowband compared with said bandwidth of said phase locked loop circuit, and switching said phase locked loop circuit to 2-point modulation when a modulation bandwidth corresponding to said communication mode setting signal is wideband compared with said bandwidth of said phase locked loop circuit; and a step of, when said phase locked loop circuit is switched to 2-point modulation, changing a reference frequency of that phase locked loop circuit and changing said bandwidth of said phase locked loop circuit in a wideband direction.

* * * * *

UNITED STATES PATENT AND TRADEMARK OFFICE
CERTIFICATE OF CORRECTION

| | | |
|---|---|---|
| PATENT NO. | : 7,443,261 B2 | Page 1 of 2 |
| APPLICATION NO. | : 10/591346 | |
| DATED | : October 28, 2008 | |
| INVENTOR(S) | : Hiroyuki Yoshikawa et al. | |

It is certified that error appears in the above-identified patent and that said Letters Patent is hereby corrected as shown below:

On the title page: Item (56) for the References Cited reads:

FOREIGN PATENT DOCUMENTS

JP          04358415  A * 12/1992
WO     WO 3032493  A *  4/2003 and should read:

FOREIGN PATENT DOCUMENTS

JP          04358415 A *  12/1992
WO     WO 3032493  A *   4/2003
JP       2002 368,630      12/2002
JP       2003 510,899       3/2003
JP       2002 515,205       5/2002
JP       2002 009,695       1/2002

In column 15, claim 5, line 51 reads:

"said communication system modes comprise two kinds..."

and should read:

"said communication system modes comprise two kinds of..."

In column 15, claim 6, line 64 reads:

"said communication system modes comprise two kinds..."

and should read:

"said communication system modes comprise two kinds of..."

UNITED STATES PATENT AND TRADEMARK OFFICE
CERTIFICATE OF CORRECTION

PATENT NO.         : 7,443,261 B2
APPLICATION NO. : 10/591346
DATED              : October 28, 2008
INVENTOR(S)        : Hiroyuki Yoshikawa et al.

It is certified that error appears in the above-identified patent and that said Letters Patent is hereby corrected as shown below:

In column 16, claim 10, line 54 reads:

"mode setting signal is wideband compared with said a...,"

and should read:

"mode setting signal is wideband compared with said...,"

Signed and Sealed this

Twenty-fourth Day of March, 2009

JOHN DOLL
*Acting Director of the United States Patent and Trademark Office*